| United States Patent [19] | [11] Patent Number: 4,806,450 |
| Hofmann et al. | [45] Date of Patent: Feb. 21, 1989 |

[54] PHOTOSENSITIVE PHOTOPOLYMERIZABLE RECORDING ELEMENT HAVING A TERPOLYMER BINDER IN THE PHOTOPOLYMERIZABLE LAYER

[75] Inventors: Reiner Hofmann, Neustadt; Axel Sanner, Frankenthal, both of Fed. Rep. of Germany

[73] Assignee: BASF Aktiengesellschaft, Ludwigshafen, Fed. Rep. of Germany

[21] Appl. No.: 54,993

[22] Filed: May 28, 1987

[30] Foreign Application Priority Data

Jun. 6, 1986 [DE] Fed. Rep. of Germany ....... 3619130

[51] Int. Cl.[4] ............................................. G03C 1/76
[52] U.S. Cl. ..................................... 430/281; 430/286; 430/287; 430/906; 430/910
[58] Field of Search ............... 430/906, 910, 281, 286, 430/287

[56] References Cited

U.S. PATENT DOCUMENTS

| 3,833,384 | 9/1974 | Noonan et al. | 430/910 |
| 4,239,849 | 12/1980 | Lipson | 430/910 |
| 4,273,857 | 6/1981 | Leberzammer et al. | 430/910 |
| 4,427,760 | 1/1984 | Nagazawa et al. | 430/910 |
| 4,537,855 | 8/1985 | Ide | 430/910 |
| 4,606,993 | 8/1986 | Fujikawa et al. | 430/910 |

*Primary Examiner*—Jack P. Brammer
*Attorney, Agent, or Firm*—Keil & Weinkauf

[57] ABSTRACT

A photosensitive recording element which is suitable for the production of printing plates or resist images, possesses a photopolymerizable recording layer which is applied to a dimensionally stable base, can be developed in an aqueous alkaline medium and contains, as a polymeric binder, one or more film-forming copolymers which are insoluble in water but soluble or dispersible in aqueous alkaline solutions and consist of from 10 to 50% by weight of one or more hydroxyalkyl (meth)acrylates, from 8 to 30% by weight of acrylic acid and/or methacrylic acid and from 30 to 80% by weight of one or more alkyl (meth)acrylates, some of the carboxyl groups of the copolymer being esterified by reaction with glycidyl (meth)acrylate.

9 Claims, No Drawings

PHOTOSENSITIVE PHOTOPOLYMERIZABLE RECORDING ELEMENT HAVING A TERPOLYMER BINDER IN THE PHOTOPOLYMERIZABLE LAYER

The present invention relates to a photosensitive recording element having a photopolymerizable recording layer which is applied to a base, contains a polymeric binder developable in an aqueous alkaline medium and is particularly suitable for the production of printing plates or resist images.

The known photosensitive recording elements which can be washed out with aqueous alkaline developers and are suitable for the production of photopolymeric printing plates or ressist images contain, on a dimensionally stable base, for example a plastic film or a metal sheet, a photopolymerizable recording layer which in general consists of a mixture of one or more polymeric binders which are soluble or dispersible in the aqueous alkaline developers, one or more ethylenically unsaturated, photopolymerizable, low molecular weight compounds and one or more photoinitiators, with or without further additives and/or assistants which improve and/or modify the processing properties and/or performance characteristics.

Polymeric binders used for the photopolymerizable recording layers which can be developed in aqueous alkaline media are, in particular, carboxyl-containing or carboxylic anhydride-containing copolymers which are soluble or dispersible in the aqueous alkaline developers, for example styrene/maleic anhydride copolymers, styrene/maleic half ester copolymers, alkyl(meth)acrylate/(meth)acrylic acid copolymers or copolymers of styrene, alkyl (meth)acrylates and (meth)acrylic acid and, if appropriate, other comonomers (cf. inter alia DE-B-No. 20 27 467, U.S. Pat. No. 190,211, DE-A-No. 22 05 146, EP-A-No. 49 504 or DE-A-No. 27 36 058). U.S. Pat. No. 3,796,578 describes photopolymerizable mixtures of esterification products of carboxyl-containing copolymers with ethylenically unsaturated compounds which carry an oxirane ring, an ethylenically unsaturated compound and a photopolymerization initiator, and their use for the production of offset printing plates. However, the compatibility of these products is still unsatisfactory. It has also been proposed to use amphoteric copolymers as polymeric binders in photopolymerizable mixtures, the said copolymers consisting of a basic comonomer, e.g. an N-alkyl(meth)acrylamide or an alkyl aminoalkyl(meth)acrylate, an acidic comonomer, e.g. (meth)acrylic acid, and one or more further comonomers, e.g. alkyl (meth)acrylates, hydroxyalkyl (meth)acrylates, vinyl esters, styrene or the like (cf. U.S. Pat. No. 4,293,635).

Although the known photosensitive recording materials which can be developed in an aqueous medium are already useful for many purposes, a number of their properties are still unsatisfactory. For example, in the photopolymerized state, they are frequently too sensitive to the washout medium, i.e. the sensitivity to overwashing during development is high. Many fine image elements are difficult to reproduce using these recording materials, and the washout conditions such as washout time, temperature and composition of the developer have to be kept within very narrow limits. Furthermore, residual layers are readily formed during development in the case of the known recording materials which can be developed in aqueous alkaline media, i.e. the parts of the recording layer which are not photopolymerized during imagewise development cannot be removed completely and satisfactorily from the base. This phenomenon, which occurs n particular where metallic bases or substrates are used for the photopolymerizable recording layer, is particularly troublesome in the production of resist images and lithographic printing plates.

It is an object of the present invention to provide novel photosensitive recording elements which have a photopolymerizable recording layer developable in aqueous alkaline media and are suitable for the production of photopolymeric printing plates or resist images. It is a particular object of the present invention to provide photosensitive recording elements which have good developability and a very wide development latitude during washout with aqueous alkaline developers, without their general property profile being adversely affected. The said recording layers should exhibit particularly good adhesion to metallic bases or substrates without forming residual layers during processing in the areas to be washed out.

We have found, surprisingly, that this object is achieved by photosensitive recording elements which have a photopolymerizable recording layer which is applied to a dimensionally stable base and can be developed in an aqueous alkaline medium, if the said recording layer contains, as the polymeic binder, one or more film-forming copolymers which are insoluble in water but soluble or dispersible in aqueous alkaline solutions and consist of from 10 to 50% by weight of one or more hydroxyalkyl (meth)acrylates, from 8 to 30% by weight of acrylic acid and/or methacrylic acid and from 30 to 80% by weight of one or more alkyl acrylates, alkyl methacrylates and/or vinyl aromatics in copolymerized form, and some of the carboxyl groups of the copolymer are esterified by reaction with glycidyl acrylate or glycidyl methacrylate.

The present invention accordingly relates to a photosensitive recording element which is suitable for the production of printing plates or resist images and has a photopolymerizable recording layer which is applied to a dimensionally stable base, can be developed in an aqueous alkaline medium and contains a polymeric binder, wherein the said recording layer contains, as the polymeric binder, one or more film-forming copolymers which are insoluble in water but soluble or dispersible in aqueous alkaline solutions and consist of from 10 to 50% by weight of one or more hydroxyalkyl acrylates and/or hydroxyalkyl methacrylates, from 8 to 30% by weight of acrylic acid and/or methacrylic acid and from 30 to 80% by weight of one or more monomers from the group consisting of alkyl acrylates, alkyl methacrylates and styrene, some of the carboxyl groups of the copolymer being esterified by reaction with glycidyl (meth)acrylate.

The polymeric binder therefore contains (a) from 10 to 50% by weight of one or more hydroxyalkyl (meth)acrylates, (b) from 8 to 30% by weight of acrylic acid and/or methacrylic acid and (c) from 30 to 80% by weight of one or more alkyl acrylates, alkyl methacrylates and/or vinyl aromatics as copolymerized units, the sum of the percentages stated under (a) to (c) being 100, with the proviso that some of the carboxyl groups of the copolymer, preferably from 10 to 60% of these groups, are esterified by reaction with glycidyl acrylate or glycidyl methacrylate.

The use, according to the invention, of the special copolymers as a polymeric binder in the photopolymerizable recording layers gives photosensitive recording elements having advantageous properties, some of which are surprisingly improved. Particularly suitable recording elements are those in which from 10 to 60% of the carboxyl groups of the copolymer are esterified with glycidyl (meth)acrylate, and those whose copolymers partially esterified with glycidyl (meth)acrylate have acid numbers of from 20 to 100 mg of KOH/g. Thus, in spite of a comparatively low content of acrylic acid and/or methacrylic acid in the copolymers to be used according to the invention, the photosensitive recording elements, after imagewise exposure to actinic light, exhibit good developability in aqueous alkaline developers coupled with good resistance, in the photopolymerized state, to aqueous media, as employed, for example, during use of the printing plates or resist images. The novel photosensitive recording elements have little sensitivity to overwashing during development, the photopolymerizable recording layer is also stable on metallic bases or substrates and simultaneously exhibits good adhesion to these bases or substrates, and the said recording elements permit exact and reliable reproduction of fine image elements too, for example lines having a width of 100 μm or less.

The polymeric binders present according to the invention in the photopolymerizable recording layer of the photosensitive recording elements are special copolymers of hydroxyalkyl (meth)acrylates which are insoluble in pure water but soluble or dispersible in aqueous alkaline solutions. Preferably, the hydroxyalkyl (meth)acrylate copolymers are soluble or dispersible in aqueous alkaline solutions having a pH greater than about 9, in particular about 9-13, but insoluble in aqueous alkaline solutions having a pH of less than about 9. The copolymers to be used according to the invention should be filmforming and generally have a mean weight average molecular weight greater than about 10,000, preferably from about 15,000 to about 500,000, in particular from about 20,000 to 250,000.

The copolymers to be used according to the invention and obtained by partial esterification of the carboxyl groups with glycidyl (meth)acrylate are prepared in a conventional manner by copolymerization of hydroxyalkyl (meth)acrylates, (meth)acrylic acid and alkyl (meth)acrylates and/or vinyl aromatics. The copolymers may contain one or more comonomers of the individual types of comonomers as copolymerized units, i.e. they may consist of one or more hydroxyalkyl acrylates and/or hydroxyalkyl methacrylates, acrylic acid and/or methacrylic acid and one or more alkyl acrylates, alkyl methacrylates and/or vinyl aromatics. Some of the carboxyl groups of the copolymer are esterified with glycidyl acrylate or glycidyl methacrylate.

Particularly suitable hydroxyalkyl (meth)acrylates are the hydroxyalkyl acrylates and/or hydroxyalkyl methacrylates where hydroxyalkyl is of 2 to 4 carbon atoms. This group of comonomers preferably comprises the monoacrylates and monomethacrylates of alkanediols, in particular of ethylene glycol, propane-1,2-diol and propane 1,3-diol. Specific examples of the hydroxyalkyl (meth)acrylate comonomers are 2-hydroxyethyl acrylate, 2-hydroxyethyl methacrylate, 2-hydroxypropyl acrylate, 3-hydroxypropyl acrylate, 2-hydroxypropyl methacrylate, 3-hydroxypropyl methacrylate and in particular mixtures of 2-hydroxypropyl and 3-hydroxypropyl (meth)acrylate. The amount of hydroxyalkyl (meth)acrylate comonomers present as copolymerized units in the copolymers to be used according to the invention is from 10 to 50, preferably from 15 to 45, % by weight based on the copolymer.

The copolymers contain, as a second group of comonomers, acrylic acid and/or methacrylic acid in an amount from 8 to 30, in particular from 10 to 20, % by weight, based on the copolymer, as copolymerized units.

Examples of the group consisting of the alkyl (meth)acrylate comonomers are, in particular, the acrylates and methacrylates of straight-chain or branched monoalkanols of 1 to 8, preferably 1 to 4, carbon atoms. The alkyl acrylates and/or alkyl methacrylates can be replaced completely or, preferably, partly, in amounts of from 1 to 40% by weight, based on the total amount of the comonomers copolymerized in the copolymer, by vinyl aromatics, such as styrene, vinyltoluene or α-methylstyrene. The amount of alkyl (meth)acrylate and/or vinyl aromatic comonomer units in the copolymer is from 30 to 80, preferably from 40 to 70, % by weight, based on the copolymer. The limits for the amount of the individual comonomer groups in the copolymers are important with regard to their general properties and especially with regard to the novel photosensitive recording elements produced from them.

Examples of copolymers which, after partial esterification of the carboxyl groups with glycidyl (meth)acrylate, have proven particularly advantageous for use as polymeric binders in the photopolymerizable recording layers of the novel photosensitive recording elements are hydroxypropyl acrylate/methacrylic acid/methyl methacrylate copolymers, hydroxypropyl acrylate/acrylic acid/methyl methacrylate copolymers and hydroxyethyl methacrylate/methacrylic acid/methyl methacrylate copolymers which contain the comonomers as copolymerized units in the above ratios.

The copolymers to be used according to the invention as polymeric binders can be prepared by a conventional polymerization method, by copolymerization of the comonomers, for example in solution. Examples of suitable solvents for the solution polymerization are lower alkanols, ketones, esters and the like. Suitable polymerization initiators are the conventional free radical initiators, for example azobisisobutyronitrile, benzoyl peroxide and the like. The polymerization temperature is in general from 50° to 100° C.

Partial esterification with glycidyl acrylate and/or glycidyl methacrylate is carried out in general in a conventional manner by reacting the carboxyl-containing copolymers with glycidyl (meth)acrylate at from 60° to 120° C., preferably in an inert solvent, such as methyl ethyl ketone or a glycol dialkyl ether.

Functionalization of the carboxyl-containing copolymers with glycidyl (meth)acrylate can advantageously be carried out as follows: from 10 to 20% strength solutions of the carboxyl-containing copolymers in diethylene glycol dimethyl ether are initially taken, and a solution consisting of 30 parts of glycidyl (meth)acrylate, 2 parts of a thermal polymerization inhibitor (e.g. Xyligen A1) and 2 parts of a catalyst (e.g. dimethylaminopyridine, N-methylimidazole or tetrabutylammonium iodide) is added dropwise in the course of about 2 hours at about 110° C. The reaction is generally complete after about 3.5 hours. The cold reaction mixture can be diluted to a solids content of 1–5% and precipitated in water. The precipitated copolymer can then be filtered off and dried, these steps being carried out in a conventional manner.

The photopolymerizable recording layer of the novel photosensitive recording elements may contain one or more hydroxyalkyl (meth)acrylate copolymers of the type under discussion, as polymeric binders. In addition to the polymeric binder, the said layer generally also contains one or more ethylenically unsaturated, photopolymerizable, low molecular weight compounds and one or more photopolymerization initiators or a photopolymerization initiator system, with or without further additives and/or assistants for improving or modifying the general properties of the photosensitive recording elements or of the printing plates or resist images produced from them.

Suitable ethylenically unsaturated, photopolymerizable low molecular weight compounds are both monomers and ethylenically unsaturated, photopolymerizable oligomers having a molecular weight up to about 5,000, the said low molecular weight compounds being either monofunctional or polyfunctional, i.e. possessing one or more photopolymerizable, ethylenic double bonds. Usually, the photopolymerizable recording layer contains difunctional or polyfunctional ethylenically unsaturated, photopolymerizable low molecular weight compounds alone or as a mixture with a minor amount of monofunctional ethylenically unsaturated, photopolymerizable, low molecular weight compounds. Typical examples of the said low molecular weight compounds, which may be present in the photopolymerizable recording layer alone or as a mixture with one another, are, in particular, the derivatives of acrylic acid and methacrylic acid, especially the (meth)acrylates. Examples of these are the di- and tri(meth)acrylates of di- or polyols, such as ethylene glycol, diethylene glycol, triethylene glycol, polyethylene glycols having a molecular weight up to about 500, propane-1,2-diol, propane-1,3-diol, polypropylene glycols having a molecular weight up to about 500, butane-1,4-diol, 1,1,1-trimethylolpropane, 2,2-dimethylpropanediols, glycerol or pentaerythritol; pentaerythritol tetra(meth)acrylate, glucose tri- or tetra(meth)acrylate; the monoacrylates and monomethacrylates of the stated diols and polyols, e.g. ethylene glycol mono(meth)acrylate, di-, tri- or tetraethylene glycol mono(meth)acrylate, propanediol mono(meth)acrylate and butanediol mono(meth)acrylate, and the (meth)acrylates of monoalkanols, in particular those of monoalkanols of 1 to 20 carbon atoms. Other examples of ethylenically unsaturated, photopolymerizable low molecular weight compounds are the monomeric and oligomeric urethane acrylates and methacrylates having two or more acryloyl and/or methacryloyl groups in the molecule. Such monomeric or oligomeric urethane (meth)acrylates, which, in addition to the acryloyl and/or methacryloyl groups, may also contain free carboxyl groups, are obtainable by a conventional process, for example by reacting diols or polyols of the above type with di- or polyisocyanates, e.g. hexamethylene diisocyanate, isophorone diisocyanate or the like, with formation of a reaction product having free isocyanate groups, and reacting these isocyanate groups with, for example, hydroxyalkyl (meth)acrylates. It is also possible initially to react the hydroxyalkyl (meth)acrylates with the di- or polyisocyanates and then to react the resulting unsaturated isocyanate with the diol or polyol component. To introduce free carboxyl groups into the urethane compounds, some of the hydroxyl groups of the diol or, preferably, polyol component can be reacted with polybasic carboxylic acids or, in particular, cyclic dicarboxylic anhydrides with formation of the acidic partial esters of the carboxylic acids. Other suitable ethylenically unsaturated, photopolymerizable, low molecular weight compounds for the novel photosensitive recording elements are the compounds containing acryloyl and/or methacryloyl groups, as obtained by reacting acrylic acid and/or methacrylic acid with di- or polyepoxide compounds.

In addition to the preferably used acrylates and methacrylates, in particular those of the abovementioned type, other examples of the said low molecular weight compounds are the allyl compounds and other vinyl compounds, e.g. N-vinylpyrrolidone, N-vinylcaprolactam, vinyl acetate, vinyl propionate, (meth)acrylamide, N-methylol(meth)-acrylamide, the bisethers of ethylene glycol and of N-methylol(meth)acrylamide, vinyl carbamates, bisacrylamidoacetic acid and others.

The ethylenically unsaturated, photopolymerizable, low molecular weight compounds chosen are those which are compatible with the hydroxyalkyl (meth)acrylate copolymers used as polymeric binders, this choice being obvious to the skilled worker. The ratio of polymeric binder to the said low molecular weight compounds in the photopolymerizable recording layer can be varied within wide limits, for example from 5:95 to 90:10, and generally in particular from 40:60 to 90:10. The amount of polymeric binders and ethylenically unsaturated, photopolymerizable low molecular weight compounds in the photopolymerizable recording layer depends not only on the type of these compounds but in particular on the desired property spectrum of the photosensitive recording elements and of the printing plates or resist images produced from them. In general, this ratio is chosen so that the photopolymerizable recording layer is solid at room temperature. This applies in particular to the use of the novel photosensitive recording materials as a photoresist film. Otherwise, the criteria for choosing the ratio of polymeric binder to the said low molecular weight compound as a function of the type of these compounds are familiar to the skilled worker.

Suitable photopolymerization initiators for the photopolymerizable recording layers are the photoinitiators or photoinitiator systems which are known per se and are conventionally used for photosensitive, photopolymerizable recording materials. Examples are benzoin, benzoin ethers, in particular benzoin alkyl ethers, substituted benzoins, alkyl ethers of substituted benzoins, for example α-methylbenzoin alkyl ethers or α-hydroxymethyl benzoin alkyl ethers; benzils, benzil ketals, in particular benzil dimethyl ketal, benzil methyl ethyl ketal or benzil methyl benzyl ketal; the acyl phosphine oxide compounds which are effective photoinitiators, for example substituted benzoyldiarylphosphine oxides; benzophenone, derivatives of benzophenone, 4,4′-dimethylaminobenzophenone, 4,4′diethylaminobenzophenone and derivatives of Michler's ketone; anthraquinone and substituted anthraquinones; aryl-substituted imidazoles or their derivatives, e.g. 2,4,5-triarylimidazole dimers; 2-chlorothioxanthone and the acridine or phenacine derivatives which are effective photoinitiators. Examples of initiator systems are combinations of the stated initiators with sensitizers or activators, in particular tertiary amines. Typical examples of such initiator systems are combinations of benzophenone or benzophenone derivatives with tertiary amines, such as triethanolamine or Michler's ketone, or mixtures of 2,4,5-triarylimidazole dimers and 2-mercaptobenzoquinazole or the leuko bases of triphenylmethane dyes. The choice of suitable photoinitiators or photoinitiator systems is familiar to the skilled worker. The photoinitiators or photoinitiator systems are present in the photopolymerizable recording layer in general in amounts of from 0.001 to 10, in particular from 0.05 to 5, % by weight, based on the photopolymerizable recording layer.

Examples of other additives and/or assistants which may be present in the photopolymerizable recording layer of the novel photosensitive recording elements are thermal polymerization inhibitors, dyes and/or pigments, photochromic compounds or systems, sensitometric regulators, plasticizers, leveling agents, fillers, reinforcing agents, dulling agents, lubricants and the like. Examples of suitable thermal polymerization inhibitors are hydroquinone, hydroquinone derivatives, 2,6-di-tert-butyl-p-cresol, nitrophenols, N-nitrosoamines, such as N-nitrosodiphenylamine or the salts of N-nitrosocyclohexylhydroxylamine. Examples of dyes and/or pigments, which both act as contrast agents and serve to compact the layer, include Brilliant Green Dye (C.I. 42,040), Victoria Sky Blue FGA, Victoria Sky Blue BO (C.I. 42,595), malachite green, crystal violet, Victoria Blue B (C.I. 44,045), Rhodamine 6 (C.I. 45,160), naphthalimide dyes, azosols and 3'-phenyl-7-dimethylamino-2,2'-spiro-di-(2H-1-benzopyran). Photochromic systems which change their color reversibly or irreversibly on exposure to actinic light without disturbing the photopolymerization process are, for example, leuko dyes together with suitable activators. Examples of leuko dyes are the leuko bases of triphenylmethane dyes, such as crystal violet leuko base and malachite green leuko base, leuko basic blue, leuko pararosaniline and leuko Patent Blue A and V; Rhodamine B base is also suitable. Suitable activators for these photochromic compounds include organic halogen compounds which eliminate halogen radicals on exposure to actinic light, or hexaarylbisimidazoles. The sensitometric regulators include compounds such as 9-nitroanthracene, 10,10'-bisanthrone, phenazinium, phenoxazinium, acridinium or phenothiazinium dyes, in particular in combination with mild reducing agents, 1,3-dinitrobenzenes and the like. Suitable plasticizers are the conventional low molecular weight or high molecular weight esters, such as phthalates or adipates, benzenesulfonamide, toluenesulfonamide and tricresyl phosphate. The additives and/or assistants are present in the photopolymerizable recording layers in the effective amounts known and conventionally used for these additives. However, their amount should not in general exceed 30, preferably 20, % by weight, based on the photopolymerizable recording layer.

The mixing ratio of the individual components in the photopolymerizable recording layer is in general chosen so that the recording layer not only can be developed in an aqueous alkaline medium but advantageously is also solid at room temperature and has good film formation properties. For use as a photoresist film, the composition is furthermore chosen so that the photopolymerizable recording layer can readily be laminated, and can be transferred to a substrate with the use of pressure and, if required, heat. The thickness of the photopolymerizable recording layer is known to depend on the intended use of the photosensitive recording elements and can accordingly vary within wide limits. While it is generally about 1-50 μm for the production of resist images, suitable layer thicknesses for the production of letterpress printing plates are, for example, from about 100 pm to a few mm.

In a typical embodiment of the invention, the photopolymerizable recording layer of the photosensitive recording elements consists of a homogeneous, film-forming mixture which is soluble or dispersible in aqueous alkaline developers and comprises (a) from 40 to 90% by weight of one or more copolymers of the above type which are partially esterified with glycidyl (meth)acrylate, as the polymeric binder, (b) from 8 to 55% by weight of one or more ethylenically unsaturated, photopolymerizable low molecular weight compounds having 2 or more polymerizable double bonds, or mixtures of these with a minor amount of ethylenically unsaturated, photopolymerizable, low molecular weight compounds having only one photopolymerizable double bond, the said low molecular weight compounds being compatible with the polymeric binder, (c) from 0.001 to 10% by weight of one or more photopolymerization initiators or of a photopolymerization initiator system, and (d) from 0 to 30, in particular from 0.05 to 20, % by weight of further additives and/or assistants which improve or modify the general properties of the photosensitive recording elements or of the printing plates or resist images produced from them, for example conventional plasticizers in amounts of from 0.5 to 5, in particular from 1 to 3, % by weight.

Suitable bases for the photopolymerizable recording layers are the dimensionally stable, rigid or, preferably, flexible bases conventionally used for the photosensitive recording elements of the type under discussion, the type of base being determined, inter alia, by the intended use of the photosensitive recording elements. Thus, particularly suitable dimensionally stable bases for the production of printng plates are plastic films or sheets, e.g. polyester sheets, and metallic bases, e.g. steel or aluminum sheets. Preferably used bases for photoresist films and photosensitive film resist materials are plastic films or sheets, e.g. polyester sheets, which possess moderate adhesion to the photopolymerizable recording layer and, after lamination of the photopolymerizable recording layer with a substrate, can be peeled off from the said layer, either before or after imagewise exposure to actinic light. For the production of resist images, the photopolymerizable recording layer can also be applied directly to the substrate to be protected and, if required, permanently modified, the said substrate then serving as a base for the photopolymerizable recording layer. Examples of suitable substrates for photoresist layers are copper sheets, copper-plated bases, ceramic substrates coated with metallic or metal oxide layers, and semiconductor elements, silicon wafers and the like. The bases for the photopolymerizable recording layer can, if required, be pretreated in a conventional manner, for example mechanically, chemically, electrochemically and/or by coating with an adhesiveprimer. Furthermore, one or more intermediate layers which, in photosensitive recording elements for the production of printing plates, can be in the form of, for example, adhesion-promoting layers and/or antihalation layers can also be arranged between the photopolymerizable recording layer and the base.

A top layer or cover sheet can furthermore be arranged on that surface of the photopolymerizable recording layer which faces away from the base, the said top layer or cover sheet preferably being soluble in the same developer as the photopolymerizable recording layer or being capable of being peeled off from the recording layer before development. This top layer or cover sheet serves in particular to protect the photopolymerizable recording layer during storage and handling of the photosensitive recording materials, and also as an oxygen barrier for the said recording layer. For example, top layers consisting of polyvinyl alcohols or polyvinyl alcohol derivatives and, especially for photoresist films, cover sheets of polyolefins, e.g. polyethylene or polypropylene, have proven particularly suitable.

The novel photosensitive recording elements can be produced in a conventional manner by preparing a homogeneous mixture of the components forming the photopolymerizable recording layer and applying this mixture, in the form of a layer, to the dimensionally stable base, which may or may not be provided with an intermediate layer. Advantageously, the photosensitive recording elements are produced by dissolving the components of the photopolymerizable recording layer in a suitable solvent or solvent mixture and applying this solution to the base by casting, immersion, spraying or another known application technique, to give a layer of the desired thickness. The solvent is then removed in a conventional manner, and the photopolymerizable recording layer is dried. Suitable solvents for mixing the components and applying the photopolymerizable recording layer to the base include lower alcohols, ketones or esters, e.g. methanol, acetone, methyl ethyl ketone, ethyl acetate and the like, as well as mixtures of these.

If desired, the top layer or cover sheet can then also be applied to the photopolymerizable recording layer.

The novel photosensitive recording elements can advantageously be used for the production of printing plates or resist images by the methods conventionally used for this purpose. To do this, the photopolymerizable recording layer is exposed imagewise to actinic light, this being done after lamination with the substrate to be protected in the case of photoresist films and photosensitive film resist materials; suitable light sources for this purpose are the conventional sources of actinic light, for example UV fluorescent tubes, high pressure, medium pressure or low pressure mercury lamps, superactinic fluorescent tubes and pulsed xenon lamps, as well as UV lasers, argon lasers and the like. The wavelength emitted by the light sources should be in general from 230 to 450 nm, preferably from 300 to 420 nm, and should in particular be matched up with the individual absorption of the photoinitiator present in the photopolymerizable recording layer. The imagewise exposure to actinic light initiates photopolymerization in the exposed areas of the recording layer, this photopolymerization leading to crosslinking and hence solubility differentiation between the exposed and unexposed areas of the layer. After the imagewise exposure, the printing plate or the resist image is developed by washing out the unexposed, noncrosslinked areas of the recording layer with an aqueous alkaline developer. Development can be carried out by washing, spraying, rubbing away, brushing out etc. The novel recording elements exhibit a wide development latitude and very little sensitivity to overwashing. Suitable developers are aqueous alkaline developers which contain alkaline substances, e.g. borax, disodium hydrogen phosphate, sodium carbonate, an alkali metal hydroxide or an organic base, such as di- or triethanolamine, in solution in water, in order to bring the pH to the most advantageous value, in general from 8 to 14, preferably from 9 to 12. The aqueous alkaline developers may also contain buffer salts, for example water-soluble alkali metal phosphates, silicates, borates, acetates or benzoates. Wetting agents, preferably anionic wetting agents, and, if required, water-soluble polymers, e.g. sodium carboxymethylcellulose, polyvinyl alcohol, polysodium acrylate and the like, may also be present as further components of the developers. Although the novel recording elements are generally washed out with purely aqueous alkaline developers, it is of course possible in principle, although not necessary, for the aqueous alkaline developers also to contain small amounts of added water-soluble, organic solvents, for example aliphatic alcohols.

The novel photosensitive recording elements are distinguished by their good exposure properties and good developability in aqueous alkaline developers, making it possible to reproduce even very fine image elements faithfully to the original and reliably. The novel photopolymerizable recording layers exhibit very good adhesion to metallic or metal oxide substrates, without deposits of residual layer material being formed in the washed-out areas during development of the imagewise exposed recording layer. The said recording elements are suitable in principle for all applications in reprography and in optical information fixing, particularly for the production of printing plates and resist images.

The novel photosensitive recording elements have substantially improved photosensitivity. Consequently, some presensitized offset plates without a PVAL protective film have shorter exposure times than prior art plates.

Because of the intermolecular crosslinking of the binder, extremely large increases in molecular weight are achieved, this being manifested in the improved mechanical stability of the offset layer.

Photopolymeric offset layers based on the novel photosensitive recording media and carrying a PVAL protective film can be written on by means of lasers and are suitable for the computer-to-plate production of printing plates.

The Examples which follow illustrate the invention. In the Examples, parts and percentages are by weight, unless stated otherwise. Modification of a carboxyl-containing copolymer with glycidyl (meth)acrylate:

A copolymer (Fikentscher K value 22) of 65% of methyl methacrylate, 15% of hydroxypropyl acrylate and 20% of methacrylic acid is dissolved in diethylene glycol dimethyl ether in a reaction vessel to give a solution having a solids content of 15%. This solution is heated to 110° C., and a solution of 30 parts of glycidyl methacrylate, 2,parts of a thermal polymerization inhibitor (e.g. Xyligen ®A1) and 2 parts of an esterification catalyst (e.g. dimethylaminopyridine, N-methylimidazole or tetrabutylammonium iodide) is uniformly added dropwise at this temperature in the course of 2 hours. The reaction is complete after about 3.5 hours. After cooling, the resulting reaction mixture is diluted to a solids content of 3% and the copolymer is precipitated in water and dried at 50° C. under reduced pressure from an oil pump. The resulting copolymer has an acid number of 25 mg of KOH/g.

EXAMPLE 1

59% of the carboxyl-containing copolymer described above, modified with glycidyl methacrylate and having an acid number of 25, 30% of a monomer (diacrylate of 1,4-butanediol diglycidyl ether), 2% of Michler's ketone, 6% of 2-(4'-methoxynaphth-1'-yl)-4,6-bis-(trichloromethyl)-s-triazine, 1% of bromophenol blue and 2% of (benzene sulfonic acid n-butylamide) were processed to a homogeneous 5% strength solution in a solvent mixture consisting of 90 parts of tetrahydrofuran and 90 parts of ethyl acetate, and the solution was applied, by means of a knife coater (casting slot 35 μm, take-off speed 250 mm/minute), to electrolytically roughened and anodically oxidized aluminum bases, as typically used for lithographic printing plates.

Drying for 10 minutes at 80° C. gave, in each case, a photopolymerizable layer which was 2.5 μm thick (about 2.7 g/m$^2$). The lithographic printing plates produced in this manner (without an oxygen barrier layer) initially remained for 6 days in a closed bag. Thereafter, they were exposed to actinic light through a FOGRA PMS test strip to determine the minimum exposure time required. After exposure, the plates were developed for 45 seconds with a 1% strength aqueous sodium carbonate solution (pH about 11).

Properties of the recording elements:
  Exposure time: 30 seconds (to 3 kW Hg lamp)
  Resolution: K value (according to FOGRA) 6-8 μm
  Color change: Good
  Stability to offset
  chemicals: Similar to the prior art
  Printing: >160,000 prints

EXAMPLE 2

Example 1 was repeated, except that an oxygen barrier layer consisting of a polyvinyl alcohol (degree of hydrolysis about 98%) was applied, as a 5 μm thick layer (about 6 g/m$^2$), to the free surface of the photopolymerizable layer of the lithographic printing plates directly after drying. For these lithographic printing plates possessing an oxygen barrier layer, the required minimum exposure time and the achievable resolution were determined in the same way as for the plates without an oxygen barrier layer, by imagewise exposure to actinic light through the FOGRA PMS test strip.

Properties:
  Exposure time: 1 second (3 kW Hg lamp)
  Resolution: K value (according to FOGRA) 10-12 μm
  Color change: Good

EXAMPLE 3

Example 1 was repeated, except that the copolymer was reacted with glycidyl acrylate instead of glycidyl methacrylate (prepared as described), and was used as the binder.

Properties of the recording element prepared from this:
  Exposure time: 32 seconds (3 kW Hg lamp)
  Resolution: K value, 10 μm
  Color change: Good

EXAMPLE 4

The procedure described in Example 2 was followed, except that trimethylolpropane triacrylate was used instead of the diacrylate of 1,4-butanediol diglycidyl ether, and bromophenol blue was replaced with Victoria Blue.

Properties:
  Exposure time: 2 seconds
  Resolution: K value (according to FOGRA) 10 μm

We claim:

1. A photosensitive recording element for the production of printing plates and resist images comprising
  (A) a dimensionally stable base and
  (B) a photopolymerizable recording layer consisting essentially of the following components:
    (B1) at least one film-forming copolymer having a mean weight average molecular weight greater than about 10,000 possessing carboxyl groups and being soluble or dispersable in aqueous alkaline solution, said carboxyl groups being 10 to 60% esterified by reaction with glycidyl acrylate, glycidyl methacrylate or mixture thereof, the polymer main chain of said copolymer consisting of the following copolymerized units:
      (a) from 10 to 50% by weight, based on the sum of all the copolymerized units present, of at least one comonomer selected from the group consisting of hydroxyalkyl acrylates and hydroxyalkyl methacrylates,
      (b) from 8 to 30% by weight, based on the sum of all copolymerized units present, of acrylic acid, methacrylic acid, or mixture thereof, and
      (c) from 30 to 80% by weight, based on the sum of all copolymerized units present, of at least one copolymer selected from the group consisting of the alkyl acrylates and the alkyl methacrylates,
    (B2) at least one ethylenically unsaturated, photopolymeriable compound compatible with the said copolymer (B1) and selected from the group consisting of low molecular weight, ethylenically unsaturated, photopolymerizable monomers and photopolymerizable oligomers having a molecular weight of up to about 5,000, and
    (B3) at least one photoinitiator.

2. The photosensitive recording element of claim 1 wherein the copolymer (B1), whose carboxyl groups ar 10-60% esterified, has an acid number of from 20 to 100 mg of KOH/g.

3. The photosensitive recording element of claim 1 wherein the hydroxyalkyl (meth)acrylate is a monoacrylate or monomethacrylate of aliphatic diols of 2 to 4 carbon atoms.

4. The photosensitive recording element of claim 1 wherein the alkyl (meth)acrylate is an acrylate or methacrylate of monoalkanols of 1 to 4 carbon atoms.

5. The photosensitive recording element of claim 1 wherein said film-forming copolymer (B1) is a hydroxypropyl acrylate/-methacrylic acid/methyl methacrylate copolymer.

6. The photosensitive recording element of claim 1 wherein said film-forming copolymer (B1) is a hydroxypropyl acrylate/acrylic acid/ethyl methacrylate copolymer.

7. The photosensitive recording element of claim 1 wherein said film-forming copolymer (B1) is a hydroxyethyl methacrylate/methacrylic acid/methyl methacrylate copolymer.

8. The photosensitive element of claim 1 wherein the said ethylenically unsaturated, photopolymerizable compound (B2) is a monomer or oligomer having at least two acryloyl or methacryloyl groups.

9. The photosensitive recording element of claim 1 wherein said film-forming copolymer (B1) contains, as copolymerziable units, from 15 to 45% by weight (a), from 10 to 20% by weight (b) and from 40 to 70% by weight (c).

* * * * *

UNITED STATES PATENT AND TRADEMARK OFFICE
CERTIFICATE OF CORRECTION

PATENT NO. : 4,806,450

DATED : February 21, 1989

INVENTOR(S) : HOFMANN et al

It is certified that error appears in the above-identified patent and that said Letters Patent is hereby corrected as shown below:

IN THE CLAIMS

CLaim 6, Line 54

"acid/ethyl"

SHOULD BE

"acid/methyl"

Signed and Sealed this

Fourteenth Day of November, 1989

Attest:

JEFFREY M. SAMUELS

Attesting Officer     Acting Commissioner of Patents and Trademarks